United States Patent [19]

Henderson et al.

[11] 4,231,115
[45] Oct. 28, 1980

[54] MODULAR RADIO

[75] Inventors: Claude L. Henderson, Camby; Edmund L. Abner, Indianapolis, both of Ind.

[73] Assignee: General Aviation Electronics, Inc., Indianapolis, Ind.

[21] Appl. No.: 963,700

[22] Filed: Nov. 27, 1978

Related U.S. Application Data

[60] Division of Ser. No. 870,678, Jan. 19, 1978, Pat. No. 4,134,070, which is a continuation-in-part of Ser. No. 784,161, Apr. 4, 1977, abandoned.

[51] Int. Cl.³ .............................................. H04B 1/38
[52] U.S. Cl. ........................................ 455/73; 455/90; 455/349
[58] Field of Search .................. 325/15, 16, 310, 312, 325/353, 355, 390; 343/113 R, 113 PT; 340/27 R, 27 NA; 455/73, 89, 90, 128, 347, 349

[56] References Cited

U.S. PATENT DOCUMENTS

| | | | |
|---|---|---|---|
| 2,731,555 | 1/1956 | Beck | 325/312 |
| 2,771,559 | 11/1956 | Montmeat | 307/156 |
| 2,771,560 | 11/1956 | Creiman | 307/156 |
| 3,059,184 | 10/1962 | German | 325/312 |
| 3,091,736 | 5/1963 | German | 325/355 |
| 3,272,920 | 9/1966 | Meurer | 358/139 |
| 3,277,484 | 10/1966 | Bostwick | 340/27 NA |
| 3,449,749 | 6/1969 | McVoy | 343/113 |
| 3,525,979 | 8/1970 | Kunkel | 340/27 NA |
| 3,757,218 | 9/1973 | Oliverio et al. | 324/156 |
| 3,821,698 | 6/1974 | Tippetts | 340/27 NA |
| 3,890,614 | 6/1975 | Argentieri | 340/27 NA |
| 3,970,782 | 7/1976 | Fenne | 325/353 |
| 3,984,161 | 10/1976 | Johnson | 312/7 R |
| 4,075,619 | 2/1978 | Lapeyre | 340/27 NA |

Primary Examiner—Robert L. Griffin
Assistant Examiner—Michael Allen Masinick
Attorney, Agent, or Firm—Woodard, Weikart, Emhardt & Naughton

[57] ABSTRACT

A modular aviation NAV/COM radio which is adapted for different mounting orientations and is thereby suitable for use on a variety of aircraft includes an OBS converter-indicator which is removable from the main body receiver portion. The OBS converter-indicator is able to be mounted separately from the main body receiver portion so that it can be positioned directly in front of the pilot when cockpit space is not available to mount the entire radio directly in front of the pilot.

6 Claims, 3 Drawing Figures

MODULAR RADIO

REFERENCE TO RELATED APPLICATION

This patent application is a divisional application of Ser. No. 870,678, filed Jan. 19, 1978, now U.S. Pat. No. 4,134,070, which was a continuation-in-part patent application of Ser. No. 784,161, filed Apr. 4, 1977; now abandoned.

BACKGROUND OF THE INVENTION

1. Field of the Invention

This invention relates in general to radios and more particularly to aviation radios.

2. Description of the Prior Art

There are numerous styles of marine and aviation radios which incorporate different circuitry for different transmitting and receiving requirements.

Some patents which have come to my attention in connection with such devices are as follows:

| Patent No. | Inventor | Issue Date |
|---|---|---|
| 3,970,782 | Fenne | 7/20/76 |
| 3,091,736 | Germain | 5/28/63 |
| 2,731,555 | Beck | 1/17/56 |

Fenne discloses a modular control panel for an audiovisual receiving apparatus wherein there are two panelboards, one for frequently used controls and the other for occasionally used controls. The modular control panel may be retained in either of two positions so that either panelboard may be oriented in a displaying position.

Germain discloses a two-way radio communication unit wherein the control head and speaker may be detached and mounted separately from the main unit while remaining electrically coupled thereto. There are no provisions for different mounting arrangements for the control head to be oriented so as to face the user's line of sight.

Beck discloses a radio communication unit which is mountable on vehicles, such as automobiles, in a number of different positions. Although detachable modular units are disclosed, as with Germain, the location of the user relative to the facing direction of the control panel is not taken into consideration when the control panel is mounted in these different locations.

The design of aviation radios, such as navigation/communication radios, is complicated by the fact that cockpit space is at a premium. Although it is desirable that the converter-indicator be mounted directly in front of the pilot, there is often insufficient space to mount the entire NAV/COM radio at that location. When the converter-indicator is not directly in front of the pilot, parallax error of the converter-indicator reading can occur as well as requiring the pilot to turn his head in order to take a reading. Certain NAV/COM radios have been designed wherein the converter-indicator is constructed as a self-contained unit separate from the remainder of the radio. The disadvantage with this type of design is that the converter-indicator and the radio must be individually packaged, a factor which contributes to higher cost. Furthermore, these units must be individually mounted which may be an added inconvenience for those cockpits where space is available to mount the entire radio-converter-indicator package.

The following list of patents gives some indication of modular electronic package designs which have been conceived both for communication equipment and for other devices:

| Patent No. | Patentee | Issue Date |
|---|---|---|
| 2,771,559 | Montmeat | 11/20/56 |
| 2,771,560 | Creiman | 11/20/56 |
| 3,272,920 | Meurer | 9/13/66 |
| 3,449,749 | McEvoy | 6/10/69 |
| 3,757,218 | Oliverio et al | 9/04/73 |
| 3,984,161 | Johnson | 10/05/76 |

Montmeat discloses a portable clock radio wherein the clock and power supply are provided in one self-contained unit and a battery powered receiver is provided as a second self-contained unit.

Creiman discloses a combination switch and interlock for electrical devices whereby it is possible to electrically and mechanically attach together electrical devices mounted in separate housings.

Meurer discloses a portable television receiver including a modular measuring device wherein the measuring device may be either a field strength measuring instrument or a radio adapter for VHF reception.

McEvoy discloses an electromagnetic surveillance system designed to receive and analyze electromagnetic radiation wherein there are four modular electronic packages one each for acquisition, control, analysis and recording.

Oliverio et al. discloses an electronic instrument for testing such characteristics as resistance and voltage wherein the test probe fits within a compartment and is removable therefrom while remaining electrically coupled to the electronics of the instrument housing.

Johnson discloses a mobile communication console for two-way radio equipment wherein a modular concept for the various pieces of equipment is used for the purposes of installation convenience and to facilitate repair and replacement.

Although each of these various patents discloses a type of separately packaged modular construction for electronic equipment, none of the patents disclose a type of device wherein the one modular unit is specifically designed to be both mounted as an integral part of the main unit for one style of installation and to be mounted separately from the main unit for a different style of installation.

SUMMARY OF THE INVENTION

A combination NAV/COM aviation radio and VOR indicator according to one embodiment of the present invention comprises a main body receiver portion, a VOR indicator electrically connected within the main body receiver portion and removable therefrom, means for selectively mounting the VOR indicator in a first orientation within the main body receiver portion and in a second orientation separately from the main body receiver portion and cable means electrically connecting the main body receiver portion with the VOR indicator.

One object of the present invention is to provide an improved radio capable of different mounting arrangements.

Related objects and advantages of the present invention will be apparent from the following description.

DESCRIPTION OF THE PREFERRED EMBODIMENTS

Figure 1:
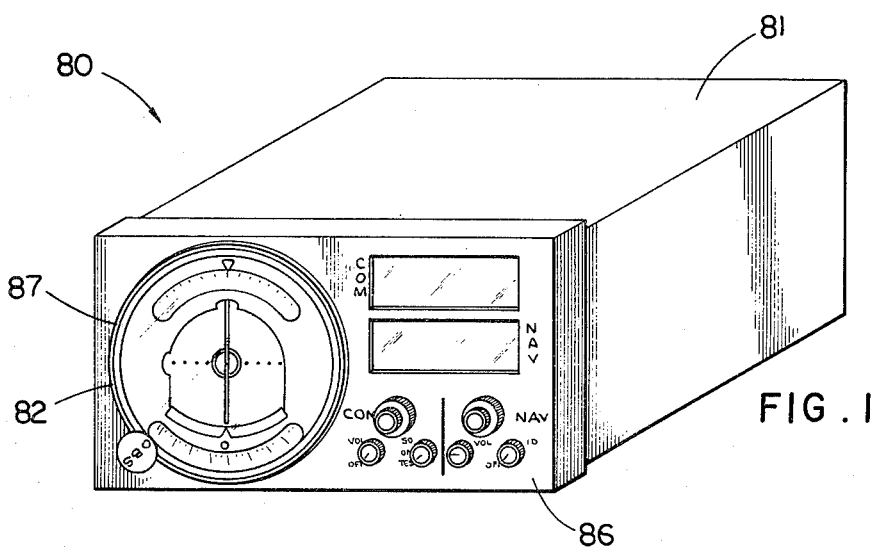
FIG. 1 is a perspective view of an aviation radio according to one embodiment of the present invention.

For the purposes of promoting an understanding of the principles of the invention, reference will now be made to the embodiments illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

It should be noted that a further mounting combination exists, that being when the head is at one elevation and the main body is at a different elevation. This would allow the head to be positioned overhead while the main body is waist high and vice versa.

Figure 2:
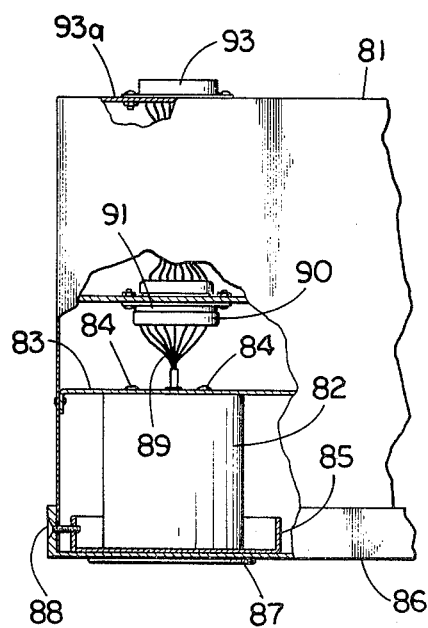
FIG. 2 is a partial fragmentary top view of the FIG. 1 radio.
Figure 3:
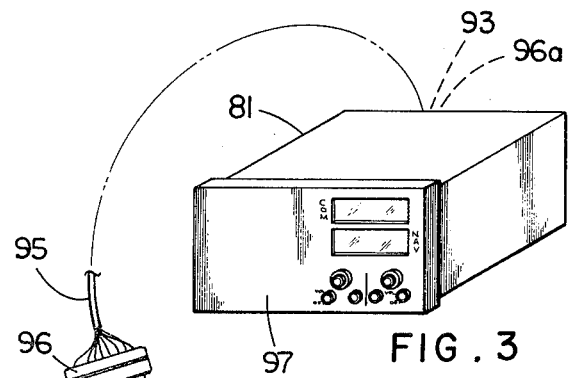
FIG. 3 is a perspective view of a converter-indicator and a main body unit separate from each other comprising portions of the FIG. 1 radio.

Referring to FIGS. 1, 2 and 3, there is illustrated an aviation radio 80 having navigation and communication modes which include main body portion 81 and removable converter-indicator 82.

In the exemplary embodiment, aviation radio 80 represents a NAV/COM aviation radio by nature of its dual navigational and communication modes of operation and convertor-indicator 82 is illustrated as a course deviation indicator with a corresponding omni bearing selector (OBS). This converter-indicator is often referred to as a VOR indicator and its corresponding electronics in main body portion 81 comprise the VOR receiver. The VOR indicator is configured as a detachable subassembly module for remote mounting and provides navigational information to the operator of the radio. Aviation radio 80 is oriented as it would be when in use in the cockpit of an airplane and mounted as a single, self-contained unit. However, there is often insufficient space in the cockpit area to be able to mount the radio as a single, self-contained unit in a location directly in front of from the pilot, even though such a mounting location is desirable so that the converter-indicator can be easily read without parallax error.

There is, however, a plurality of circular openings in the dashboard area directly in front of the pilot and one such opening could be used to mount the converter-indicator 82 if it is detachable from the main body portion 81 of the aviation radio 80. Consequently, one feature of aviation radio 80 is that the converter-indicator 82 has dual mounting provisions which permit it to be mounted within main body portion 81 as a single unit as well as mounted separate from main body portion 81 into one of the circular openings in the cockpit dashboard.

When mounted as part of main body portion 81, converter-indicator 82 is attached to a cross member 83 by means of threaded fasteners 84. Converter-indicator 82 has a generally square flange portion 85 which abuts the rear surface of front panel 86. Converter-indicator 82 also has a generally circular raised portion 87 which is positioned flush to slightly raised relative to the outer surface of front panel 86. Within one side of flange portion 85 is a plurality of internally threaded holes which are used to further secure converter-indicator 82 into position by means of threaded fasteners 88. Extending from the rear of converter-indicator 82 are a wire pigtail 89 and a multipin connector 90. The mating multipin connector 91, for connector 90, is mounted to a circuit board 92 internal to main body portion 81. Also included as part of main body portion 81 is another multipin connector 93 which is mounted to the rear surface of enclosing cabinet 93a and whose function will be described hereinafter. In this self-contained, single unit configuration, the entire aviation radio 80 is arranged for mounting in a 6½ inch wide standard rack having 6-inch bolt center spacing which is typical of most aircraft cockpits.

When it is desired to mount converter-indicator 82 into one of the circular openings of the cockpit dashboard which are directly in front of the pilot, the following procedure is followed. The radio technician who is authorized to perform aviation radio installations and repairs must first remove threaded fasteners 88 and then remove front panel 86 from main body portion 81. Next, threaded fasteners 84 are removed, connectors 90 and 91 are disconnected and converter-indicator 82 is pulled from the main body portion 81. Each circular opening in the cockpit dashboard has a surrounding hole pattern. These holes may either be internally threaded or include a staked nut. Corresponding to this particular hole pattern are three clearance holes 94 (see FIG. 3) in flange portion 85 and depending upon the particular aircraft design, converter-indicator 82 may be inserted into the selected circular opening either from the front or from the rear of the dashboard and threaded fasteners extend through holes 94 into the internally threaded holes (or staked nuts) surrounding the circular opening, thereby securely mounting the converter-indicator into the dashboard.

The electrical connection between the remote locations of converter-indicator 82 and main body portion 81 is accomplished by means of an extension cable 95 which includes multipin connector 96 at one end and a similar connector 96a at the opposite end. As illustrated, connector 96 mates with connector 90 and connector 96a mates with connector 93. The connection between connectors 91 and 93 may be hard wired in as part of the main body portion 81 or may be jumpered together at the time converter-indicator 82 is removed and remotely mounted from main body portion 81. The final step is to replace front panel 86 with a new front panel 97 which is solid in the area where the converter-indicator 82 used to be located.

Thus, aviation radio 80 provides an inexpensive and versatile way to adapt a necessary item of aircraft equipment so that a variety of mounting configurations can be accommodated by means of the same basic unit.

While the invention has been illustrated and described in detail in the drawings and foregoing description, the same is to be considered as illustrative and not restrictive in character, it being understood that only the preferred embodiments have been shown and described and that all changes and modifications that come within the spirit of the invention are desired to be protected.

What is claimed is:

1. A combination NAV/COM aviation radio and VOR indicator comprising:
   a main body receiver portion;
   a VOR indicator electrically connected within said main body receiver portion and removable therefrom;
   means for selectively mounting said VOR indicator in a first orientation within said main body receiver portion and in a second orientation separately from said main body receiver portion; and
   cable means electrically connecting said main body receiver portion with said VOR indicator.

2. The aviation radio of claim 1 wherein said main body receiver portion further includes a first connector internal thereto and a second connector, said first connector mating with said cable means when said VOR indicator is mounted in said first orientation within said main body receiver portion, said second connector mating with said cable means when said VOR indicator is mounted in said second orientation separate from said main body receiver portion.

3. The aviation radio of claim 2 wherein said main body receiver portion further includes a removable front panel.

4. A modular communication instrument for positioning in a conveyance and including navigational means for use in cooperation with the operation of the conveyance to aid in directing movement of said conveyance, said modular communication instrument comprising:
   a main body portion having at least one selectable control associated with said instrument;
   a detachable subassembly module electrically connected with and mechanically connected to said main body portion and having at least one selectable control associated with said navigational means; and
   means for mounting said subassembly module in a plurality of locations remote from said main body portion wherein said electrical connection to said main body portion is maintained in each of said locations.

5. The modular communication instrument of claim 4 wherein said main body portion and said subassembly module are electrically connected by means of a cable and said means for mounting being adapted to mount said subassembly module separately from said main body portion, said cable continuing to be used for said electrical connection when said subassembly module is mounted separately from said main body portion.

6. The modular instrument of claim 5 wherein said mounting means for said subassembly module includes a flange member adjacent one end of said subassembly module, said flange member having a plurality of internally threaded holes therein.

* * * * *